United States Patent [19]
Odawara et al.

[11] Patent Number: 5,834,938
[45] Date of Patent: Nov. 10, 1998

[54] NONDESTRUCTIVE INSPECTION APPARATUS WITH SUPERCONDUCTING MAGNETIC SENSOR

[75] Inventors: Akikazu Odawara; Kazuo Chinone; Satoshi Nakayama, all of Chiba, Japan

[73] Assignee: Seiko Instruments Inc., Japan

[21] Appl. No.: 699,894

[22] Filed: Aug. 16, 1996

[30] Foreign Application Priority Data

Aug. 18, 1995 [JP] Japan .................................... 7-210783
Jun. 26, 1996 [JP] Japan .................................... 8-166346

[51] Int. Cl.$^6$ ........................ G01R 33/035; G01R 31/28; G01N 27/82
[52] U.S. Cl. ........................ 324/248; 324/224; 324/235; 324/241; 324/262; 324/263; 324/750; 324/760; 505/846
[58] Field of Search .................................... 324/201, 224, 324/226, 235, 238–243, 248, 262, 263, 529, 537, 750, 760; 128/653.1; 505/160–162, 842, 843, 845, 846, 892

[56] References Cited

U.S. PATENT DOCUMENTS

| 4,079,730 | 3/1978 | Wikswo, Jr. et al. .............. 324/201 X |
| 4,827,217 | 5/1989 | Paulson .................................... 324/248 |
| 5,134,368 | 7/1992 | Otaka et al. ......................... 324/248 X |
| 5,491,411 | 2/1996 | Wellstood et al. .................. 324/262 X |

OTHER PUBLICATIONS

Pelizzone et al; A SQUID Susceptometer for Fields up to 8.5 Tesla, Appl. Phys. 24, No. 4, Apr. 1981, pp. 375–379.

Primary Examiner—Gerard R. Strecker
Attorney, Agent, or Firm—Adams & Wilks

[57] ABSTRACT

To provide a nondestructive inspection apparatus with a reduced distance between a superconducting magnetic sensor and an object under inspection, a cryostat for cooling the sensor to a superconducting state is provided with inner and outer vessels. The inner vessel has a baseplate on which the magnetic sensor is disposed, and has an inner wall defining a central chamber for containing a refrigerant for cooling the magnetic sensor. The outer vessel has an inner wall defining a central chamber for containing the inner vessel, the magnetic sensor and the stage. A gap between the inner and outer vessels is evacuated to insulate the inner chamber from the ambient atmosphere. To facilitate ease of transferring an object to and from the stage for inspection, a load lock area is provided adjoining the outer vessel. The load lock has a movable inner wall portion opening to the inner chamber of the outer vessel and a movable outer wall portion opening to the ambient atmosphere so as to permit the transfer of an object to be inspected to and from the stage.

20 Claims, 8 Drawing Sheets

NONDESTRUCTIVE INSPECTION APPARATUS WITH SUPERCONDUCTING MAGNETIC SENSOR

BACKGROUND OF THE INVENTION

The present invention relates to a system used for the measurement of a magnetic field, and more particularly, to nondestructive inspection equipment for carrying out defect inspection for scratch and corrosion detection in iron materials and electric conductors and for defect inspection of a pattern of electronic circuitry in an IC, and to the method for measuring a magnetic field.

A SQUID (Superconducting Quantum Interference Device) has a sensitivity which is three orders of magnitude higher than the sensitivity of a high sensitivity magnetic sensor in a flux-gate fluxmeter. The SQUID has been applied in various fields to magnetic field sensors having high sensitivity and high space resolving power because the detecting area is five orders of magnitude smaller than the area of the high sensitivity magnetic sensor. The typical nondestructive inspection equipment using a SQUID as a sensor is used for measuring a magnetic flux density of an object inspected or a magnetic flux density when an external magnetic field is impressed and for inspecting defects such as scratches and corrosion of iron material and electric conductors.

FIG. 2 is a block diagram showing an example of prior nondestructive inspection equipment. The nondestructive inspection equipment comprises at least a SQUID 10, a sensor driving circuit 20, cryostat 30, analysis and display device 50, a stage 40 and a stage controller 41. The cryostat 30 comprises an inner vessel 38 and an outer vessel 39, and the inner vessel 38 is joined at the top of the outer vessel 39. The inner vessel 38 and the outer vessel 39 are shielded by vacuum, and a refrigerant is kept in the inner vessel 38. The SQUID 10 is kept in a superconducting state in the device by inserting a probe 100 keeping the SQUID 10 in the cryostat 30. The stage 40 is used for setting the position of the object inspected 60 set on the stage 40 and the SQUID 10 and for scanning. The stage 40 is usually adjusted in the vertical direction so that the distance between an outer face of the portion where the SQUID 10 of the cryostat 30 is set and the object inspected 60 becomes minimum, and is scanned in the horizontal direction in the inspection range of the object being inspected 60.

Using the SQUID 10 operated as a magnetic sensor by a driving circuit 20, the magnetic flux density of the object being inspected 60 is measured in any range, and display of distribution is carried out by the analysis and display device 50. If there is a defect in an object inspected 60 of formed iron material, the defect is found by observing the distribution of magnetic flux density because magnetic flux density which the object inspected has by itself, and an externally applied magnetic flux change by the change of transmittance depending on whether the material has the defect or not.

A space resolving power, which is an important capability of the nondestructive inspection equipment, depends on the distance between the SQUID 10 and the object inspected. This is limited by the base portion of inner vessel 38, the vacuum shielding layer, and the base portion of outer vessel 39. The vacuum shielding layer expands because the inner vessel 38 shrinks when refrigerant is put into the inner vessel 38 of cryostat 30. The minimum distance between the SQUID 10 and the object inspected 60 is therefore about 5 mm.

An inspection result of a space resolving power using the prior nondestructive inspection equipment is shown. An object inspected forming a wiring pattern 62 comprised of copper on a surface of a board 61 comprised of glass epoxy is shown in FIG. 7.

The result of scanning a center portion of the pattern by the SQUID passing a current of 25 mA flow through the wiring pattern 62 (each space of wiring is 2 mm) is shown in FIG. 8. From FIG. 8, it can be seen that a magnetic field distribution of a wiring pattern with 2 mm spacing is not able to be detected when the distance between the pattern and the SQUID is 6 mm.

In prior nondestructive inspection equipment, liquid nitrogen has been used as the first refrigerant and liquid helium has been used to get a superconducting state after an intermediate step of refrigeration by the first refrigerant.

In above mentioned prior nondestructive inspection equipment, there is a limit to how small the distance between the superconducting magnetic sensor and the object being inspected maybe, and it has been difficult to improve the space resolving power because the bottom of the cryostat has a vacuum shielding layer between the superconducting magnetic sensor and the object inspected. In prior nondestructive inspection equipment, moreover, it has taken a long time to prepare for the measurement because liquid nitrogen has been used as the first refrigerant and liquid helium has been used to achieve a superconducting state after intermediate step of refrigeration by the first refrigerant.

SUMMARY OF THE INVENTION (The first means)

The present invention has an inspection area in a cryostat and has a stage and an object inspected in the inspection area.

(The second means)

Adding the first means, the present invention has a baseplate made of metal on a surface of inner vessel of the cryostat opposite an outer vessel and has a superconducting magnetic sensor on the baseplate.

(The third means)

The present invention has a load lock between the inspection area in the cryostat and the outer vessel.

(The fourth means)

The present invention has a means for applying magnetic field on the object inspected in a nondestructive inspection equipment.

(The fifth means)

A refrigerator is formed connecting to the cryostat.

(The sixth means)

A means for refrigerating the superconducting magnetic sensor by gas is formed.

In the construction of the nondestructive inspection equipment using the first means, space resolving power is raised because the distance between the superconducting magnetic sensor and the object inspected is able to be shortened.

The second means can refrigerate the superconducting magnetic sensor in superconducting state, can measure at the state that there is not any shielding layer between the superconducting magnetic sensor and the object inspected, and can set the object inspected near the superconducting magnetic sensor.

The third means can repeat a cycle of transferring the object inspected into the load lock, exhaust of vacuum and inhaling air, and can inspect plural objects without transfer of the refrigerant.

By using the fourth means, it becomes possible to inspect defects of a magnetic material which is weak in coercive force and nonmagnetic materials such as aluminum and copper because the magnetic field is impressed closer to the object being inspected than in prior equipment and energy supply to outer magnetic field is reduced.

The fifth means is able to make cryostat small-sized and to operate for a long inspection time because the SQUID can be refrigerated without transferring the refrigerant to the cryostat and it does not need to fill the refrigerant.

By using the sixth means, a refrigerating speed of superconducting magnetic sensor becomes higher than that of prior equipment using refrigerant of liquid and the time to make the superconducting magnetic sensor a superconducting state can be shortened. Therefore total time to inspect can be shortened.

DESCRIPTION OF THE PREFERRED EMBODIMENTS

By reference to the figures, embodiments of the present invention are described below.

(The first embodiment)

Figure 1:
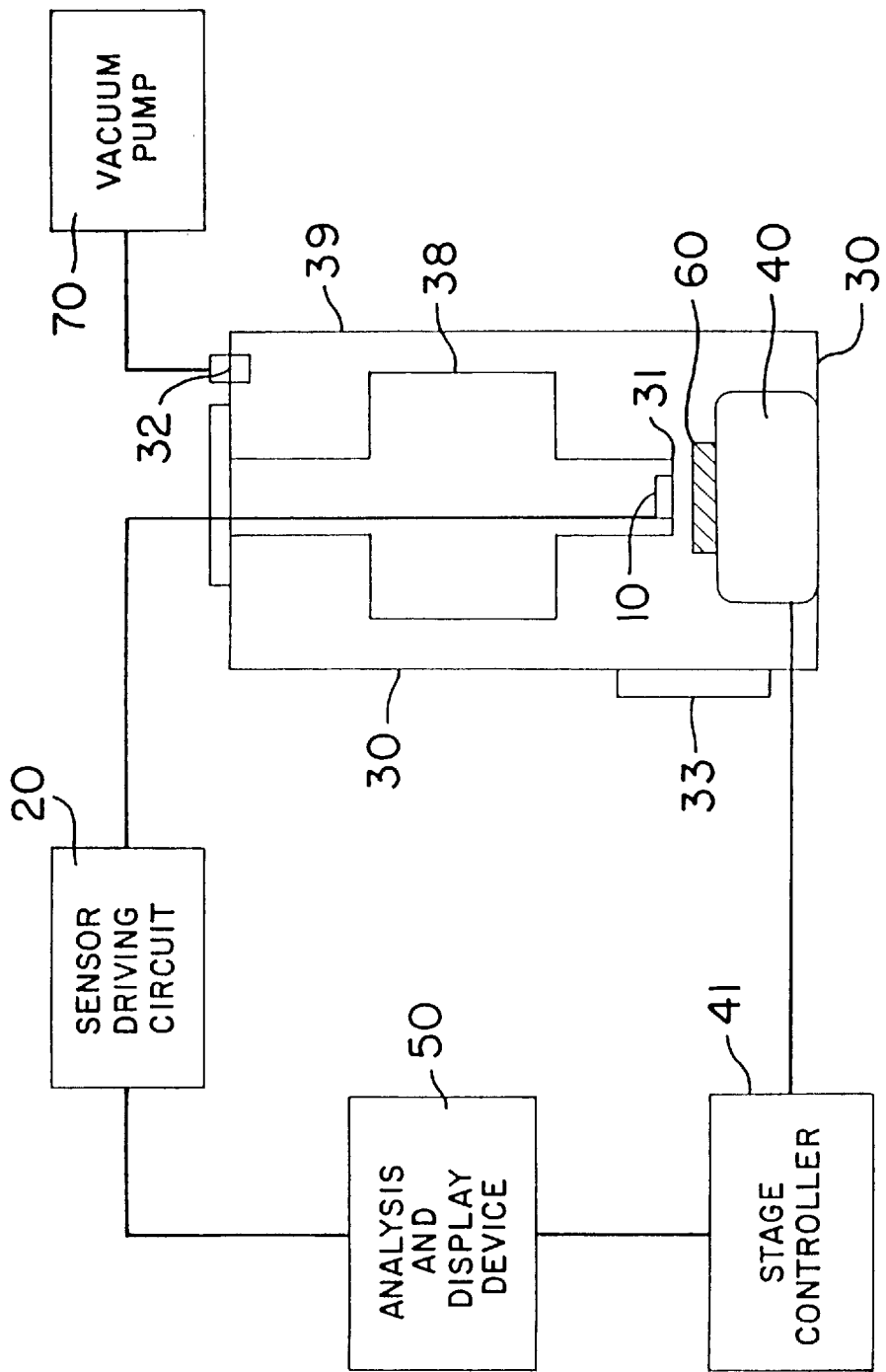
FIG. 1 is a view showing a nondestructive inspection instrument of the present invention.

FIG. 1 is a view showing a construction of nondestructive inspection equipment of the first embodiment. Although the embodiment uses a SQUID for a superconducting magnetic sensor, it is also possible to use other superconducting magnetic sensors such as a superconducting magnetic resistance element.

A cryostat 30 comprises an outer vessel 39 and an inner vessel 38. Refrigerant is maintained in the inner vessel 38 by insulating between the outer vessel 39 and the inner vessel 38. It is desirable that the outer vessel 39 and the inner vessel 38 should be made of fiber reinforced plastic ("FRP") which is nonmagnetic and strong, but it is possible to be made of metallic materials such as aluminum and stainless steel. In order to reduce the influence of external magnetic noise, the outer vessel 39 should be made of materials such as a permalloy or a multilayer construction of permalloy and copper.

Figure 2:
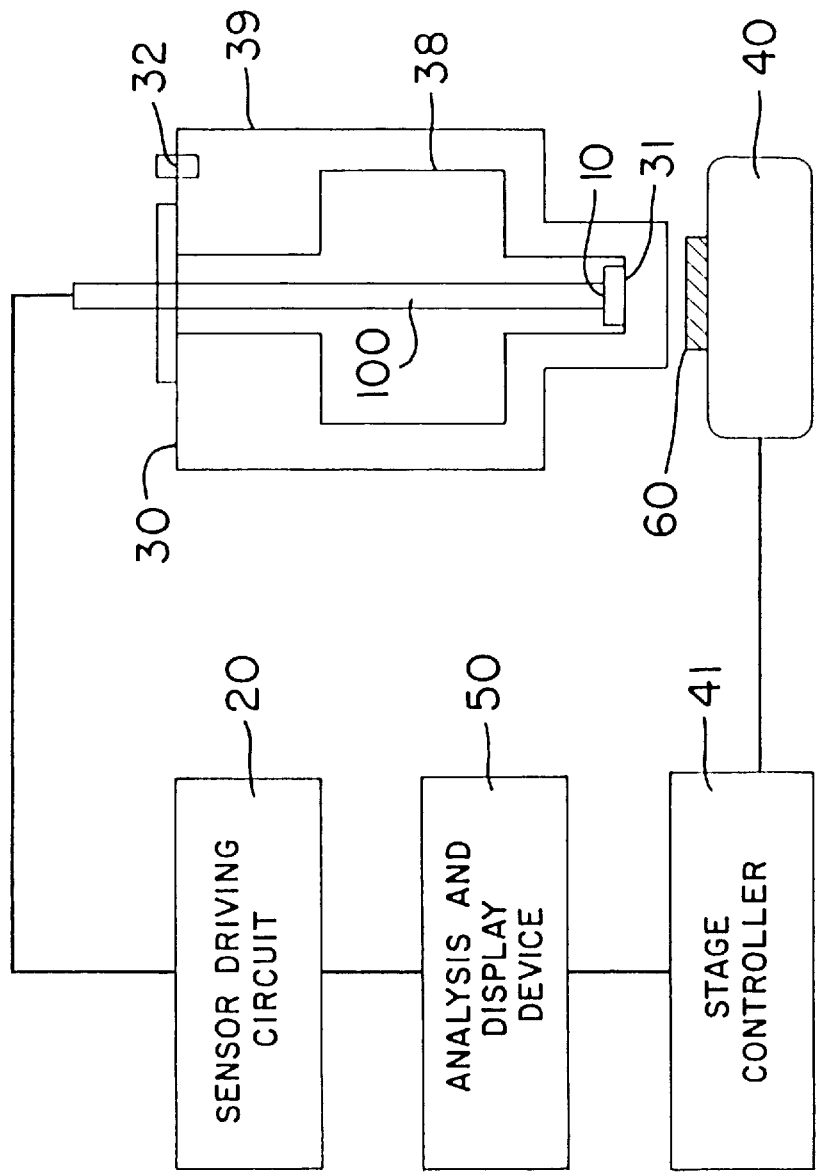
FIG. 2 is a block diagram showing prior nondestructive inspection equipment using an SQUID.

In the cryostat 30, a SQUID 10 is directly set on a baseplate 31 which is able to be installed in and to be detached from the inner vessel 38 of the cryostat 30 in order to shorten the distance between an object inspected 60 and the SQUID. It is possible to use a probe 100 shown in FIG. 2 instead of the SQUID 10 of the embodiment.

Although the baseplate 31 is a board made of FRP, 0.6 mm thickness, it is possible to use FRP boards inserting multilayer sheets such as aluminum for shielding of thermal radiation, metal boards such as copper, and high thermal conductivity materials such as sapphire.

A wiring pattern for wiring to the SQUID 10 and a connector for connecting to inside wiring of the cryostat connected to a SQUID driving circuit are formed on the surface of baseplate 31.

Although the SQUID 10 and the wiring pattern of baseplate 31 are connected by superconducting bump, it is possible to connect by an ordinary bonding wiring. In the way of super conducting bump, the distance between the object being inspected and the SQUID can be made shorter than the conventional way of bonding wiring and it is useful to raise space resolving power because the electrode surface of SQUID 10 is set facing the baseplate 31.

Although the baseplate 31 is installed on the inner vessel 38 so that the SQUID 10 faces inside of the inner vessel, it is possible install it facing outside of the inner vessel in case that the baseplate 31 is made of high conductivity materials such as copper because the baseplate 31 becomes superconducting when refrigerated by thermal conduction. In that case, it is useful to raise space resolving power because the SQUID comes closer to the object inspected.

A low-Tc-SQUID of Nb group is used for the SQUID 10. The SQUID 10 is kept in a superconducting state by storing liquid helium in the of inner vessel 38 of cryostat 30 as a refrigerant. It is possible to use a Hi-Tc-SQUID for the SQUID 10. In that case, liquid nitrogen may be used as a refrigerant.

A stage 40 is formed in an inspection portion of the cryostat 30 to adjust the distance between object inspected 60 and baseplate 31 and to scan the object inspected.

The stage 40 is made of nonmagnetic plastics such as FRP, Bakelite and Derlin, and nonmagnetic metals such as aluminum and brass. A supersonic wave motor made of nonmagnetic material is used for a power source of the stage so as not to generate magnetic noise. It is possible to use an air cylinder, an air stepping motor, and an ordinary motor with magnetic shielding rather than a supersonic wave motor.

The cryostat 30 has a vacuum exhaust valve 32 and a door 33. Exhaust for vacuum evacuation of the inspection room is carried out through the vacuum exhaust valve 32 using a vacuum pump 70 after the object inspected 60 is inserted through the door 33 and set on the stage 40. When the degree of vacuum becomes about $1 \times 10^{-4}$ Torr, for example, the refrigerant is transferred. The distance between SQUID 10 and object inspected 60 is within 1 mm by setting the object inspected as near as possible after the transfer ends and shrinkage becomes stable.

Figure 7:
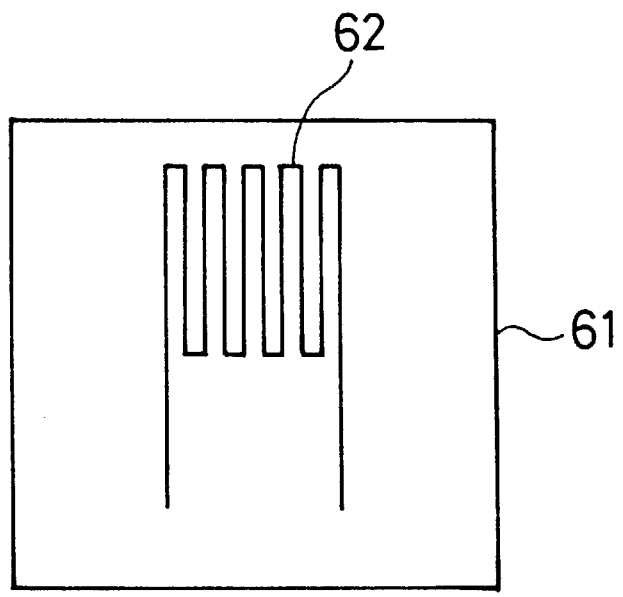
FIG. 7 is a view showing a wiring pattern to compare space resolving powers.
Figure 8:
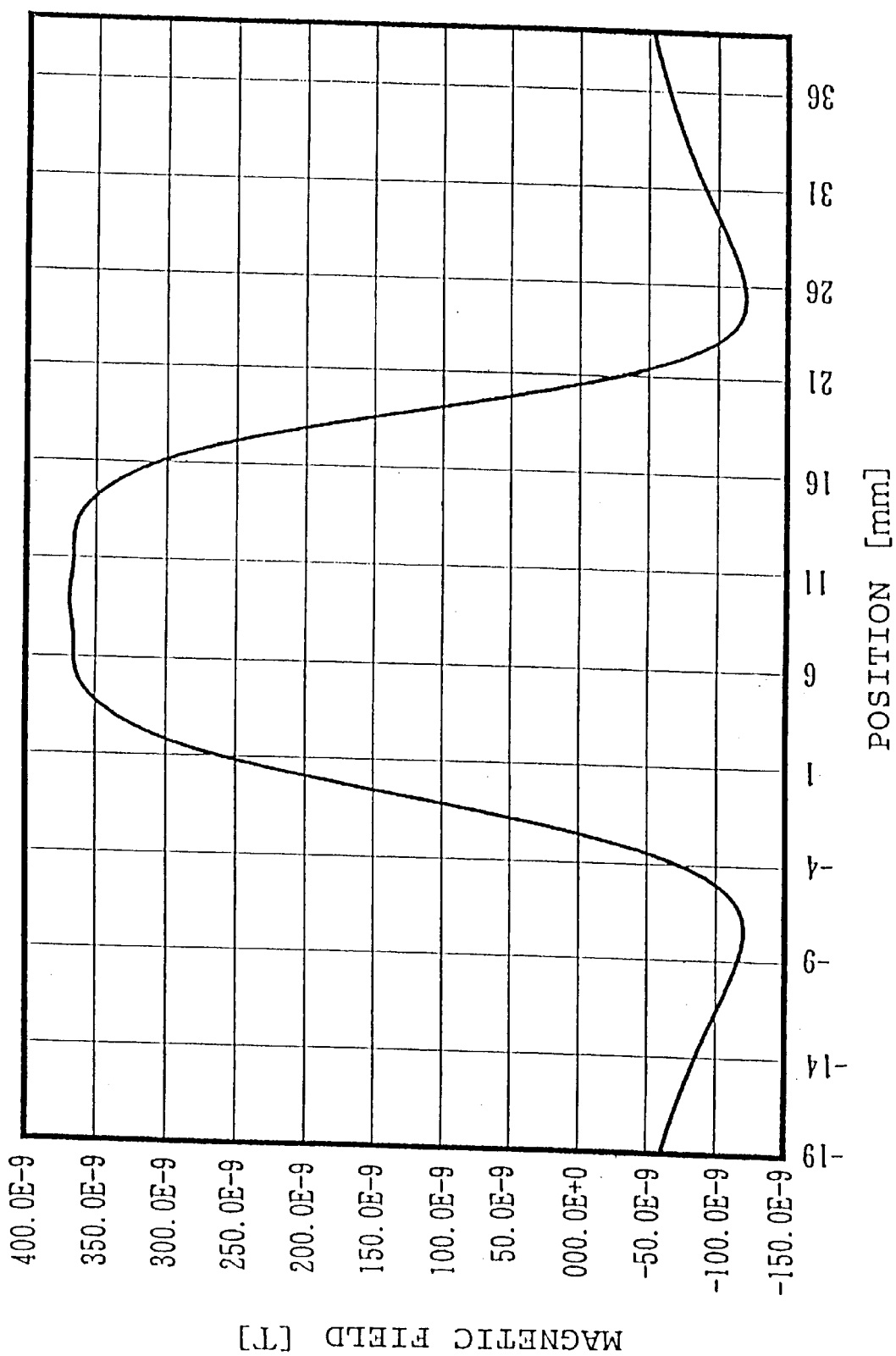
FIG. 8 is a graph showing an example measured by prior nondestructive inspection equipment.
Figure 9:
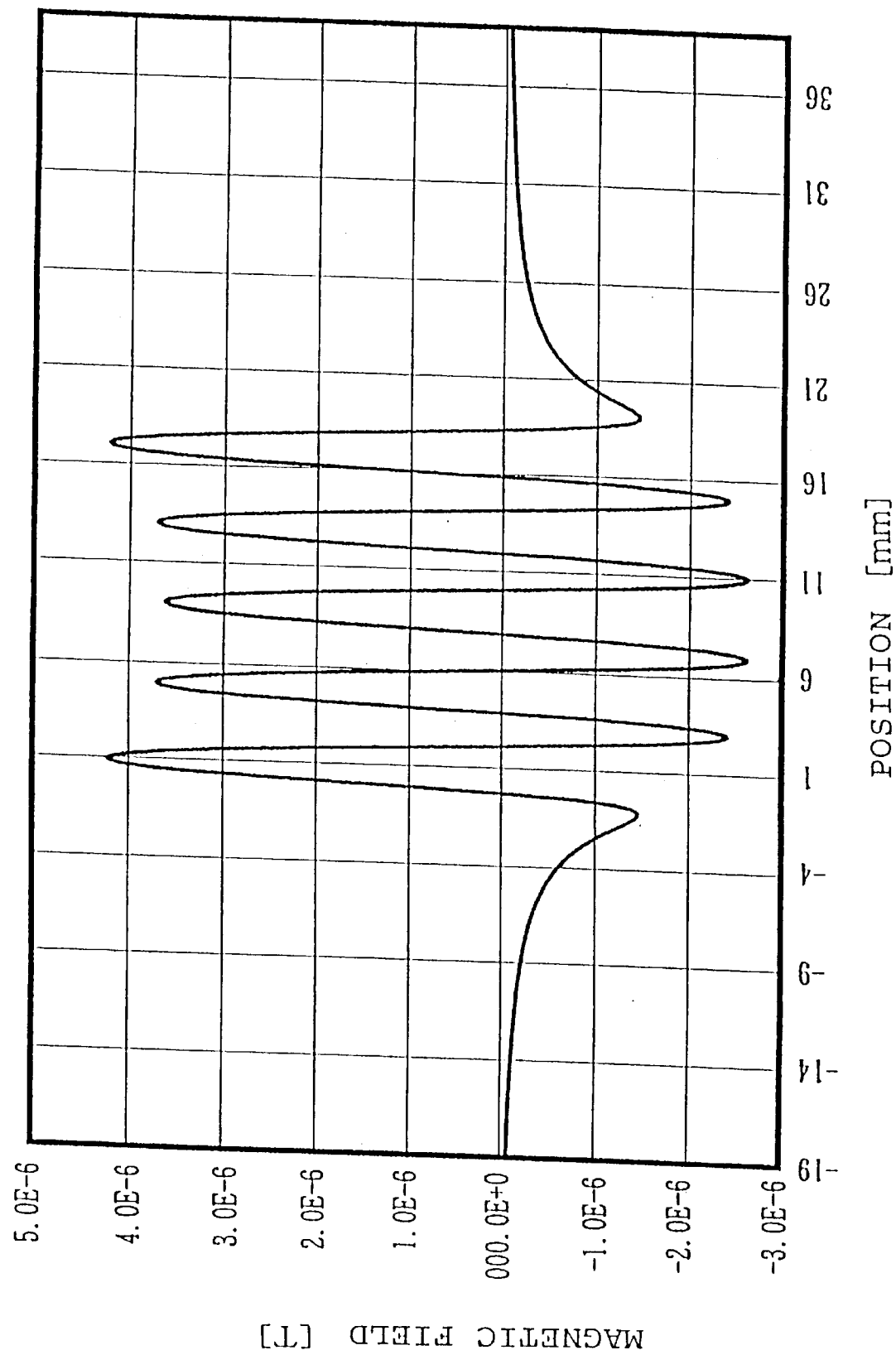
FIG. 9 is a graph showing an example measured by the nondestructive inspection equipment of the first embodiment of the present invention.

The inspection result of space resolving power carried out using the equipment of the first embodiment is shown in FIG. 9. The inspection was carried out by flowing 25 mA current to the wiring pattern shown in FIG. 7 and scanning a center part of the pattern by the SQUID in the same way as the prior equipment. The distance between pattern and SQUID was 1.1 mm.

The separation of each wiring is confirmed from the result of FIG. 9.

(The second embodiment)

Figure 3:
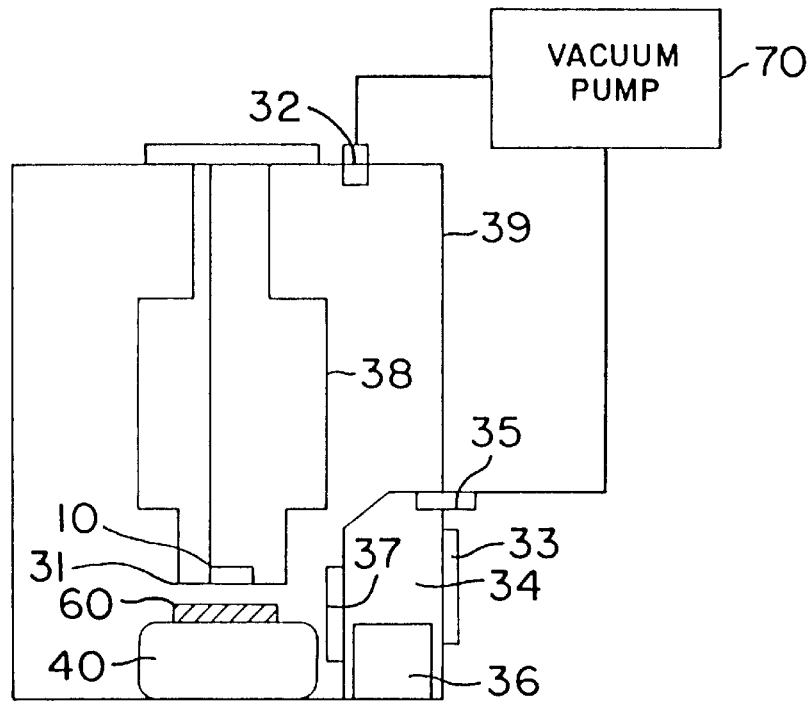
FIG. 3 is a view showing the construction of a cryostat having a load lock in the nondestructive inspection equipment of the second embodiment of the present invention.

FIG. 3 is a view showing the construction of cryostat 30 having a load lock in nondestructive inspection equipment in the second embodiment of the present invention. The load lock 34 is characterized to be set between the inspection portion in the cryostat 30 shown in the first embodiment and the outer vessel 39. The equipment is same as the equipment of the first embodiment except the cryostat 30. A vacuum exhaust valve 35, a transfer device 36 for the object inspected and gate valve 37 are formed in the load lock 34. Inspection order using the nondestructive inspection equipment of the present invention is described bellow.

Vacuum exhaust is in advance carried out and refrigerant is transferred to the inner vessel 38. The object inspected 60 is set on the transfer device 36 of the load lock area 34, an entrance is closed, and vacuum exhaust in the load lock area 34 is carried out. When the degree of vacuum becomes about $1 \times 10^{-4}$ Torr, for example, the object inspected 60 is set on the stage by opening the gate valve 37 and by being transferred by the transfer device 36, and the defective inspection of object inspected in the same way of the first embodiment. When the inspection as the object inspected ends, it is possible to change the object inspected for a new one in the following way by the second embodiment. First, the object 60 which has been inspected is transferred to the load lock area 34, and the gate valve is closed. The vacuum of load lock area 34 is put back to air pressure with air or inert gas such as nitrogen gas, and the object inspected is changed for a new one opening the door 33. After that, the inspection is carried out in the same way as the first inspection order. According to the nondestructive inspection of the second embodiment, it is possible to inspect plural objects inspected without a transfer of refrigerant.

(The third embodiment)

Figure 4:
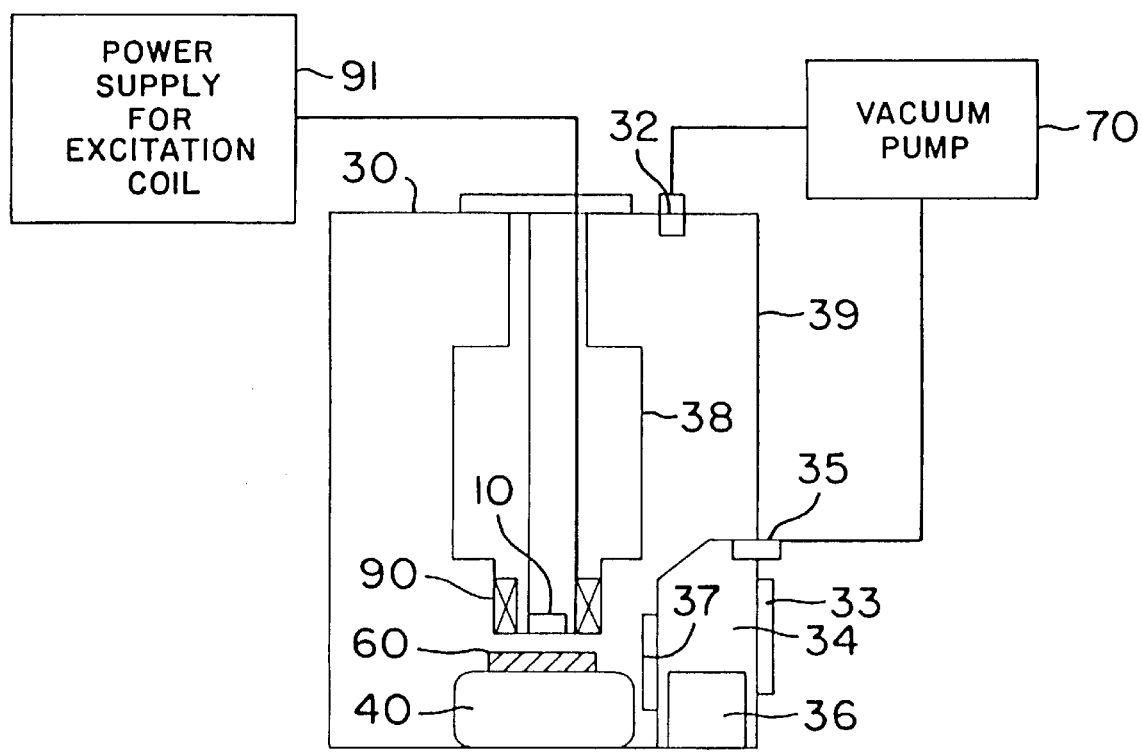
FIG. 4 is a view showing the peripheral construction cryostat of the nondestructive inspection equipment in the third embodiment of the present invention.

FIG. 4 is a view showing a peripheral construction of cryostat 30 of the nondestructive inspection equipment in the third embodiment of the present invention. An excitation coil 90 made of NbTi wire is characterized to be set in the inner vessel 38 and is powered by a power supply 91. It is possible that the wiring material of the excitation coil 90 may be made of other superconducting wires and normal conducting wire such as copper and, in the case of the normal conducting wire, is set in the inspection area and outside of the cryostat 30. If the object inspected is magnetic, it is possible to use a permanent magnet instead of the excitation coil 90.

According to the equipment of the third embodiment, it is possible to inspect defects of a magnetic material which is weak in coercive force and nonmagnetic materials such as aluminum and copper in high space resolving power.

(The fourth embodiment)

Figure 5:
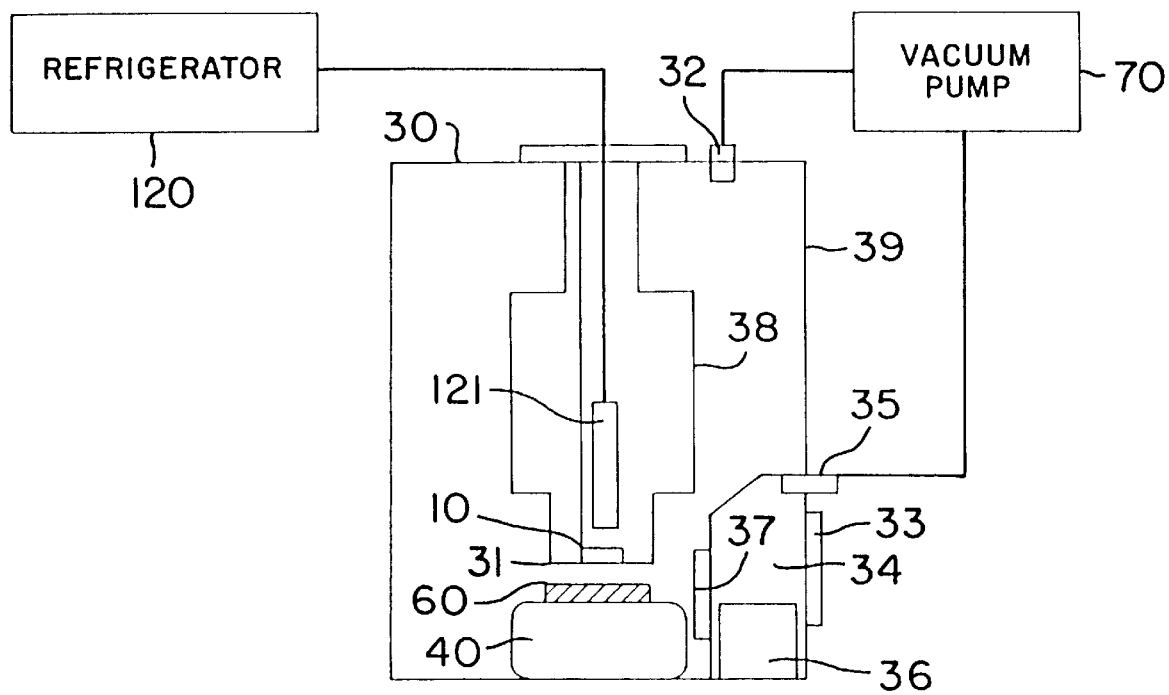
FIG. 5 is a view showing a peripheral construction of the cryostat of the nondestructive inspection equipment in the fourth embodiment of the present invention.

FIG. 5 is a view showing a peripheral construction of cryostat 30 of the nondestructive inspection equipment in the fourth embodiment of the present invention. It is characterized in that refrigerant is not transferred to the inner vessel 38 of the cryostat 30 and the SQUID 10 is refrigerated 120, 121 by a refrigerator.

According to the fourth embodiment, it is possible to inspect for a long time with the small cryostat 30 and to inspect any time.

(The fifth embodiment)

Figure 6:
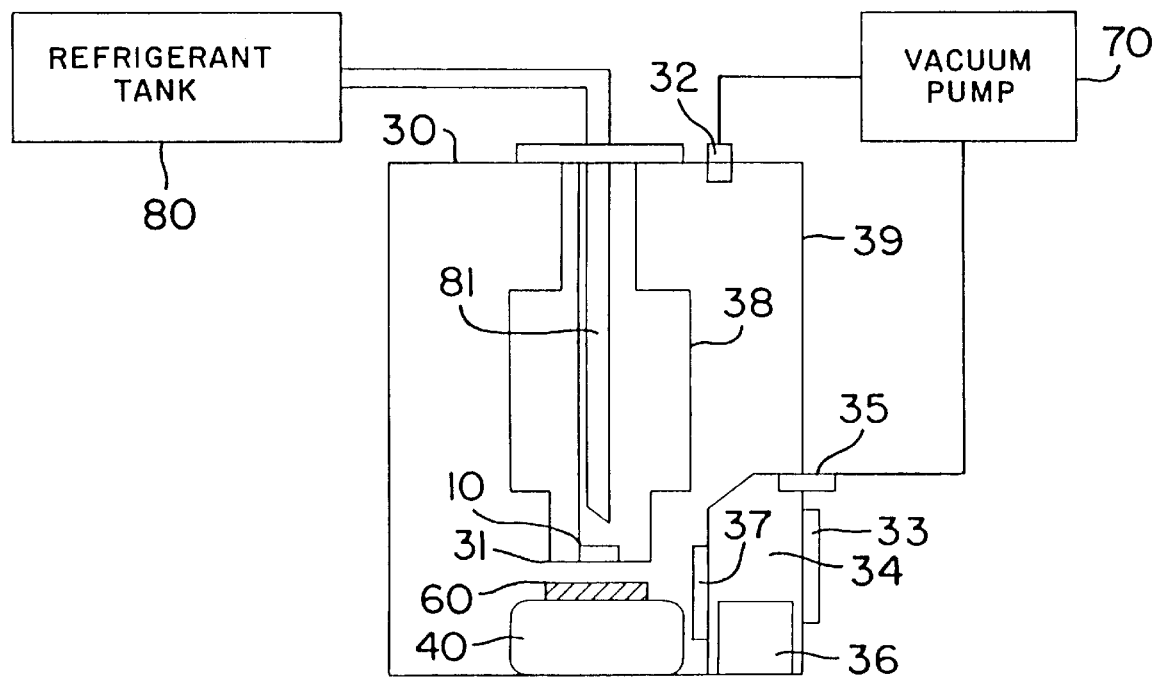
FIG. 6 is a view showing a peripheral construction of the cryostat of the nondestructive inspection equipment in the fifth embodiment of the present invention.

FIG. 6 is a view showing a peripheral construction of cryostat 30 of the nondestructive inspection equipment in the fifth embodiment of the present invention. A refrigerant tank 80 stores a coolant. A blow down pipe 81 is used to refrigerate the SQUID 10 with gas. The SQUID 10 is put in a superconducting state by blowing helium gas which is lower in transition temperature of the SQUID than that of the blow down pipe 81. It is possible to use $N_2$ gas in the case that Hi-Tc-SQUID is used in the SQUID 10.

According to the fifth embodiment, the time that the SQUID takes to reach a superconducting state is shorter than using liquid refrigerant. The embodiment is useful especially for the equipment not having a load lock area in the cryostat 30 like the equipment shown in the first embodiment.

(The sixth embodiment)

Figure 10:
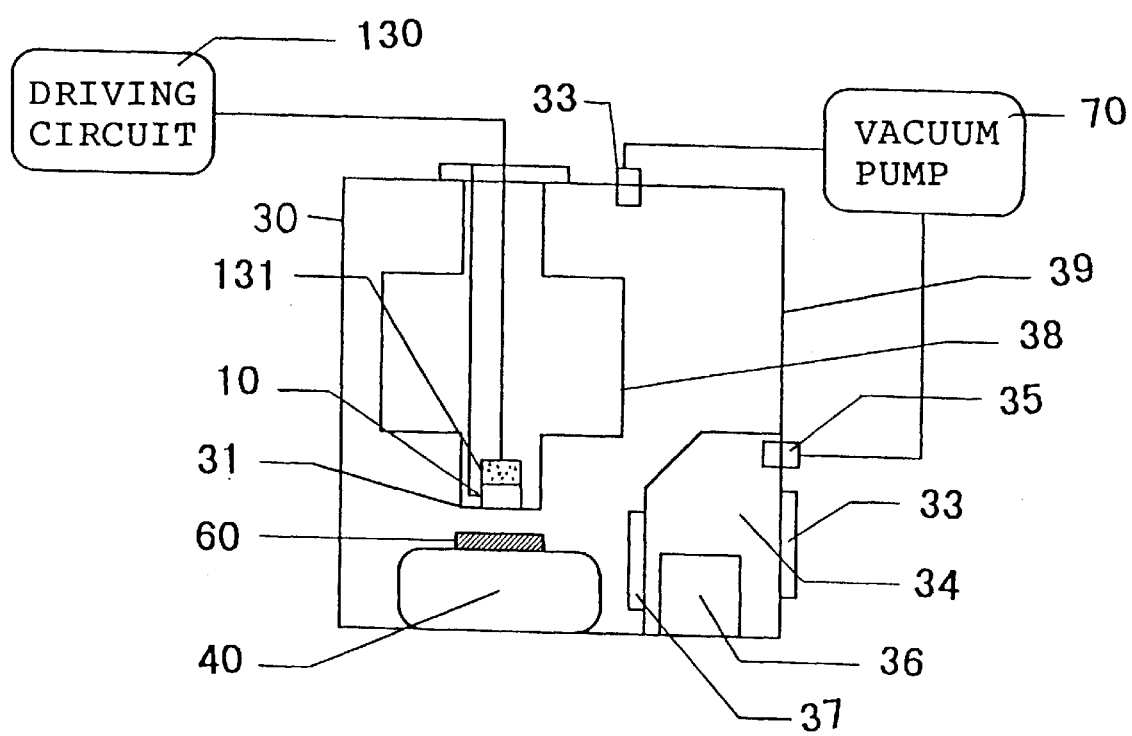
FIG. 10 is a view showing the peripheral construction of the cryostat of the nondestructive inspection equipment in the sixth embodiment of the present invention.

FIG. 10 is a view showing a peripheral construction of cryostat 30 of the nondestructive inspection equipment in the sixth embodiment of the present invention. An electronic refrigerating means 131 and its driving circuit 130 are used to refrigerate the SQUID 10. Nitrogen refrigerated or helium gas is filled in the inner vessel 38 and the electronic refrigerating means 131 reaches a superconducting state, thereby refrigerating the SQUID 10 directly. It does not need to decrease within the transition temperature of SQUID. It is possible to use Peltier element for the electronic refrigerating means.

According to the present invention, the space resolving power rises and it becomes possible to detect small defects because the distance between the SQUID and the object inspected can be shortened.

What is claimed is:

1. A nondestructive inspection apparatus comprising: a superconducting magnetic sensor for detecting magnetic signals from an object to be inspected and converting the magnetic signals into electric signals; an electronic circuit for driving the superconducting magnetic: sensor; a stage for holding and moving the object to be inspected relative to the magnetic sensor; an inner vessel having a baseplate on which the magnetic sensor is disposed, the inner vessel having an inner wall defining a central chamber for containing a refrigerant for cooling the magnetic sensor; and an outer vessel having an inner wall defining a central chamber for containing the inner vessel, the magnetic sensor and the stage, a gap between the inner and outer vessels being evacuated so as to insulate the inner chamber from the ambient atmosphere.

2. A nondestructive inspection apparatus according to claim 1; further comprising a load lock area adjoining the outer vessel, the load lock area having a movable inner wall portion opening to the central chamber of the outer vessel and a movable outer wall portion opening to the ambient atmosphere so as to permit the transfer of an object to be inspected to and from the stage.

3. A nondestructive inspection apparatus according to claim 2; further comprising a vacuum exhaust valve for evacuating the load lock area; a transfer device for transferring the object to be inspected from the load lock area to the stage; and a gate valve for adjusting a pressure between the stage and the load lock area such that the load lock area may be kept at ambient pressure when the movable outer wall is opened to place the object therein and may be evacuated when the movable inner wall is opened to transfer the object to and from the stage.

4. A nondestructive inspection apparatus according to claim 1; further comprising means for applying a magnetic field to the object.

5. A nondestructive inspection apparatus according to claim 4; wherein the means for applying a magnetic field is disposed in one of the inner and outer vessels.

6. A nondestructive inspection apparatus according to claim 1; further comprising a refrigerator disposed adjacent the outer vessel for cooling the refrigerant.

7. A nondestructive inspection apparatus according to claim 1; further comprising a gas supply means for providing a gas coolant to the inner vessel for refrigerating the superconducting magnetic sensor.

8. A nondestructive inspection apparatus according to claim 7; wherein the gas supply means includes a pipe extending from the gas supply means into the inner vessel.

9. A nondestructive inspection apparatus according to claim 1; further comprising electronic refrigeration means for refrigerating the superconducting magnetic sensor.

10. A nondestructive inspection apparatus according to claim 1; wherein the baseplate is formed of a metal.

11. A nondestructive inspection apparatus according to claim 1; wherein the baseplate is formed of a fiber reinforced plastic.

12. A nondestructive inspection apparatus according to claim 1; wherein the baseplate is formed of sapphire.

13. A nondestructive inspection apparatus according to claim 1; wherein the outer vessel is formed of a magnetically insulating material.

14. A nondestructive inspection apparatus according to claim 1; wherein the outer vessel comprises at least one metal selected from the group consisting of a permalloy and copper.

15. A nondestructive inspection apparatus comprising: a superconducting magnetic sensor for converting magnetic signals from an object to be inspected into electric signals; a cryostat for cooling the magnetic sensor; a stage for holding the object to be inspected and for moving the object in at least one direction relative to the magnetic sensor; wherein the cryostat includes an inner vessel having a baseplate on which the magnetic sensor is disposed and having a wall which, along with the baseplate, defines a central chamber for containing a coolant for cooling the magnetic sensor, and an outer vessel having a wall defining a central chamber for containing the inner vessel, the magnetic sensor and the stage, a gap between the inner and outer chambers being evacuated so as to insulate the inner chamber from the ambient atmosphere.

16. A nondestructive inspection apparatus according to claim 15; wherein the central chamber of the inner vessel contains a refrigerant for cooling the magnetic sensor.

17. A nondestructive inspection apparatus according to claim 15; wherein the superconducting magnetic sensor comprises a SQUID.

18. A nondestructive inspection apparatus according to claim 15; further comprising a load lock area adjoining the outer vessel, the load lock area having a movable inner wall portion that selectively opens to the inner chamber of the outer vessel, and a movable outer wall portion that opens to the ambient atmosphere so as to permit the transfer of an object to be inspected to and from the stage.

19. A nondestructive inspection apparatus according to claim 18; further comprising an opening formed in the load lock area; a vacuum exhaust valve connected to the opening for evacuating the load lock area; a transfer device for transferring the object to be inspected from the load lock area to the stage; and a gate valve for adjusting a pressure between the stage and the load lock area such that the load lock area may be kept at ambient pressure when the movable outer wall is opened to place the object therein and may be evacuated to a pressure consistent with that of the central chamber of the outer vessel when the movable inner wall is opened to transfer the object to and from the stage.

20. An inspection system comprising: a superconducting magnetic sensor for detecting magnetic signals from an object and converting the magnetic signals into electric signals; an electronic circuit for driving the superconducting magnetic sensor; a stage for holding the object and moving the object with respect to the magnetic sensor; an inner vessel having an inner wall defining a central chamber and having a baseplate on which the superconducting magnetic sensor is mounted; an electronic refrigerator for cooling the superconducting magnetic sensor disposed in the central chamber of the inner vessel; and an outer vessel having an inner wall defining a central chamber for housing the inner vessel and the stage, the central chamber of the outer vessel being maintained at low pressure for insulating the inner vessel from the ambient atmosphere.

* * * * *